(12) United States Patent  
Chu

(10) Patent No.: US 7,057,799 B2  
(45) Date of Patent: Jun. 6, 2006

(54) TUNING A NARROW BAND FILTER FOR TELECOMMUNICATION APPLICATIONS WITH AN ACOUSTIC OPTICAL TUNABLE FILTER

(75) Inventor: Raymond R. Chu, Cupertino, CA (US)

(73) Assignee: Acceeze, Inc., Santa Clara, CA (US)

( * ) Notice: Subject to any disclaimer, the term of this patent is extended or adjusted under 35 U.S.C. 154(b) by 69 days.

(21) Appl. No.: 10/744,987

(22) Filed: Dec. 23, 2003

(65) Prior Publication Data

US 2004/0218253 A1 Nov. 4, 2004

Related U.S. Application Data

(63) Continuation-in-part of application No. 10/428,899, filed on May 23, 2003.

(51) Int. Cl.  
*G02F 1/33* (2006.01)  
*G02F 1/11* (2006.01)

(52) U.S. Cl. .................................. 359/308; 359/287

(58) Field of Classification Search ................ 359/111, 359/237, 238, 278, 285, 287, 305, 308, 312, 359/559

See application file for complete search history.

(56) References Cited

U.S. PATENT DOCUMENTS

| | | | | |
|---|---|---|---|---|
| 4,456,338 A | * | 6/1984 | Gelbart | 359/286 |
| 5,216,484 A | * | 6/1993 | Chao et al. | 356/326 |
| 5,463,493 A | * | 10/1995 | Shah | 359/312 |
| 6,587,607 B1 | * | 7/2003 | Aoki et al. | 385/15 |

* cited by examiner

*Primary Examiner*—Georgia Epps  
*Assistant Examiner*—William Choi  
(74) *Attorney, Agent, or Firm*—Bo-In Lin

(57) ABSTRACT

An optical tunable filter that includes a thin-film filter for band-passing at least two bands of wavelengths. The tunable filter further includes a tunable band-passing device tunable over the at least two bands for tuning to a tunable pass-band spectrally overlapped with one of the at least two bands. The tunable band-passing device further includes an Acousto-optical cell tunable with acoustic wave signals. The thin-film filter cooperating with the tunable band-pass device for generating a tunable output waveform that has substantially a square waveform spectrally corresponding to the at least two bands. The thin-film filter further cooperates with the tunable band-pass device for generating a tunable output waveform having substantially a square waveform over a spectral range of a C-band, an L-band and an S-band. The tunable band-pass device band-passes a tunable substantially Sinc-function-like waveform and the thin film filter band-passing a substantially square waveform with a center attenuated dip for compensating the tunable substantially Sinc-function waveform.

57 Claims, 6 Drawing Sheets

λm: passed.
λp: blocked.
λq: attenuated.

TUNING A NARROW BAND FILTER FOR TELECOMMUNICATION APPLICATIONS WITH AN ACOUSTIC OPTICAL TUNABLE FILTER

This is a Continuous-In-Part (CIP) Application of a previously filed Application with Ser. No. 10/428,899 filed on May 3, 2003 now U.S. Pat No. 6,930,819, by one of the Applicants of this invention.

FIELD OF THE INVENTION

The present invention relates generally to apparatuses and method for providing filters for optical fiber telecommunication systems. More particularly, this invention relates to new configurations and methods for providing tunable narrow band filters implemented with acoustic optical tunable filter and a periodical thin film filter to achieve wide and flat pass-band, sharp stop-band and at high speed and broad range tuning while providing long term reliable operations under severe operational environments.

BACKGROUND OF THE INVENTION

Conventional technologies of narrow band filters are typically achieved with thin film filters that are designed to have one pass-band with flat pass-band and sharp stop-band as required in telecom applications. With evolving technology and complexity of telecommunications needs, these confronted with technical difficulties that applications of the thin film filtering technologies are no longer practical due to the requirements multiple wavelength separation and selections. The requirement is demanded by the recent developments of fiber optical telecommunication systems that employ multiplexed optical signals for signal transmission, thus requires separation of signals carried in multiple wavelength ranges. In order to achieve the tasks of separating multiple wavelengths, cascaded thin film filters each performs the function of narrow band filtering are required. For applications that involve separation of multiple wavelength signal transmissions, grating based technologies are generally applied. However, compared to the thin film filters, the grating based devices, despite a lower per channel cost, are usually implemented at a higher overall cost while providing lower optical performance characteristics such as rounded filter pass-band and slewed stop-band that results in low channel isolation.

Another difficulty of the convention narrow band filters when implemented in telecommunication system is the implementation of filters of fixed center wavelengths. Due to the fact that the center wavelengths of these filters are fixed, once a telecommunication system is completed, it is extremely difficult to reconfigure or re-route network traffic. As the high-speed network expands, so does the complication of network management and there are increased demands to reconfigure and re-route the signal transmissions. However, the demands for reconfiguration and re-routing generally requires the implementation of tunable optical devices including tunable lasers, switches and optical add/drop modules that can be conveniently reconfigured. When there are continuous expansions of the optical fiber system, these tunable optical devices, including tunable filters become the focus of attention in the development of next wave of networking technology advancement. Tunable filters start to become available among active components vendors. Available ones include MEMS and grating based filters that involve mechanical moving parts, liquid crystal ones that are electro-absorptive, thin film ones that are thermally tuned. However, these filters either lack the optical performance characteristics as demanded by the modern more complicate systems for telecommunications or lack of mechanical stability/aging/repeatability related performance characteristics. The tunable filters as now available also are often useful only for single channel application and expensive to produce.

For these reasons, there is still a need in the art to provide an improved design and manufacture process to provide a narrow band tunable filter to overcome the above-mentioned difficulties. It is desirable that the new and improved tunable filter can be produced with high level of optical performance characteristics and low cost.

SUMMARY OF THE PRESENT INVENTION

It is therefore an object of the present invention to provide a tunable narrow band filter implemented with acoustic optical tunable filter (AOTF) technology combined with a thin film filter to achieve very narrow band tuning such that the narrow band filters are suitable for modern telecommunication system implementations.

Specifically, it is an object of this invention to provide a tunable filter implemented with a fundamental configuration of a high performance single/multiple channel tunable filter based on AOTF technology and thin film technology with very narrow band-pass filtering with no moving parts to achieve highly reliable operations. It is also the object of this invention to disclose a periodic thin film design with pass-bands aligned to the ITU grids and having a complimentary pass-band/stop-band profile to that of the AOTF thus to provide a wide flat pass-band and a sharp stop-band matching or better the optical performance gauged by thin film fixed single channel filter.

It is further an object of this invention to provide a tunable multi-channel attenuator implemented in the thin-film filter and the AOTF filter of this invention. The tunable AOTF filter is provided with flexibility to drive with different RF frequency to adjust the intensity and frequency of the pass-band signals thus can fulfill the functions as an tunable attenuator.

Briefly, in a preferred embodiment, the present invention discloses a tunable filter that includes a thin-film filter for band-passing at least two bands of wavelengths. The tunable filter further includes a tunable band-passing device tunable over the at least two bands for tuning to a tunable pass-band spectrally overlapped with one of the at least two bands. In a preferred embodiment, the tunable band-passing device further includes an Acousto-optical cell tunable with acoustic wave signals. In another preferred embodiment, the thin-film filter cooperating with the tunable band-pass device for generating a tunable output waveform that has substantially a square waveform spectrally corresponding to the at least two bands. In another preferred embodiment, the thin-film filter cooperates with the tunable band-pass device for generating a tunable output waveform having substantially a square waveform over a spectral range of a C-band and an S-band. In another preferred embodiment, the tunable band-pass device band-passing a tunable substantially Sinc-function waveform and the thin film filter band-passing a substantially square waveform with a center attenuated dip for compensating the tunable substantially Sinc-function waveform. In another preferred embodiment, the tunable band-passing device further includes an Acousto-optical cell having a first and second Acousto-optical diffraction means having a set of narrow-band optical filtering Bragg grating.

In another preferred embodiment, the first and second Acousto-optical diffraction means further include a first Acousto-optical crystal and a second Acousto-optical crystal.

In a preferred embodiment, this invention further discloses a tunable optical attenuator that includes a frequency-tuning device configured as an Acousto-optical cell for cooperating with a fixed wavelength band-pass filter for flexibly tuning an intensity of a pass-band of optical signals for attenuating a designated pass-band of optical signals passing therethrough. In a preferred embodiment, the Acousto-optical cell further includes a first and a second Acousto-optical crystal. In another preferred embodiment, the Acousto-optical cell further includes a first and a second Acousto-optical diffraction means disposed in an Acousto-optical crystal. In another preferred embodiment, the Acousto-optical cell further includes a first and a second Acousto-optical diffraction columns respectively disposed in an Acousto-optical crystal. In another preferred embodiment, the first and second Acousto-optical cells are formed as a first column and a second column respectively in a birefringent crystal having a predefined responsiveness to a radio frequency (RF) driven signal. In another preferred embodiment, the first and a second Acousto-optical cells having the narrow-band optical filtering Bragg grating further includes a surface acoustic wave (SAW) grating. In another preferred embodiment, the fixed wavelength band-pass filter includes a thin-film filter. In another preferred embodiment, the fixed wavelength band-pass filter includes a fixed wavelength band-pass filter for band-passing bands of wavelengths substantially aligned with a Telecommunication ITU wavelength grid. In another preferred embodiment, the Acousto-optical cell further includes a single Acousto-optical diffraction column disposed in an Acousto-optical crystal.

These and other objects and advantages of the present invention will no doubt become obvious to those of ordinary skill in the art after having read the following detailed description of the preferred embodiment, which is illustrated in the various drawing figures.

DETAILED DESCRIPTION OF THE INVENTION

Figure 1A:
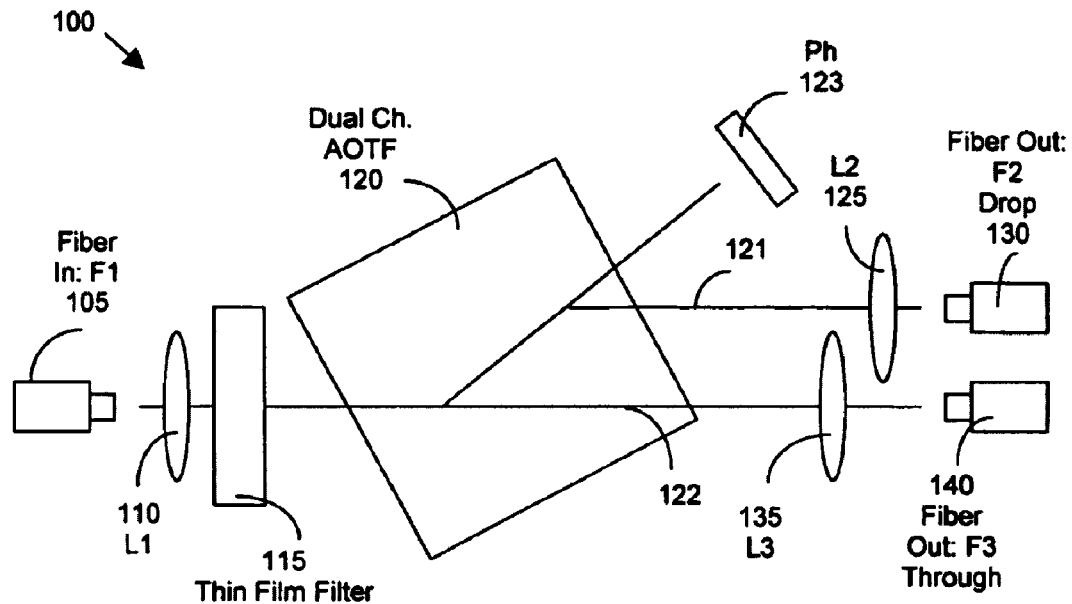
FIG. 1A is a schematic functional block diagram for showing an tunable filter implemented with a dual column Acousto-optical tunable filter (AOTF) with a thin film (TF) filter according to an improved design of this invention.
Figure 1B:
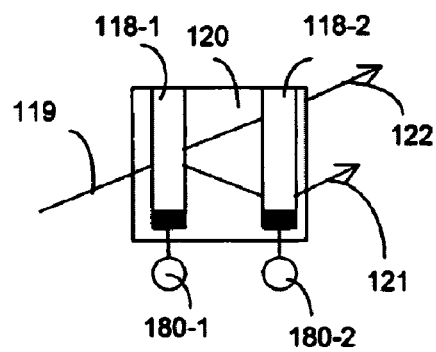
FIG. 1B shows a schematic diagram of a dual-column AOTF of FIG. 1 as a preferred embodiment of the present invention.

FIG. 1A shows a functional block diagram for a tunable narrow band filter 100 of the present invention. The tunable filter 100 is implemented with a dual column Acousto-optic tunable filter (AOTF) 120 and a thin film filter (TF) 110. The optical input signal is received from an optical fiber 105 and the input optical signals are collimated through a first lens 115 denoted as L1. The collimated incident beam carries all signals centered at all telecommunication ITU wavelength grids. The collimated beam then passes through the thin film filter 115 to project onto a dual column Acousto-optical tunable filter (AOTF) 120 where the first order diffraction 121 is projected from the first column and then diffracted again at the second column and then projects from the AOTF 120 through a second lens 125 denoted as L2 to generate a first output signal from the first output fiber 130 denoted as F2. The $0^{th}$ order light 122 is projected from the AOTF 120 through a third lens 135, i.e, L3, to a second output fiber 140 denoted as F3. The narrow band filter 100 further includes a photo diode 123 for optical intensity monitoring. The AOTF passband is tuned by an acoustic tuning input device 180-1 and 180-2 as shown in FIG. 1B which further describes more details of the passband tuning processes of the AOTF 120. The disclosures of the AOTF 120 was previously made in two other co-pending patent application Ser. Nos. 10/428,899 filed on May 3, 2003 and Ser. No. 10/455,151 filed on Jun. 4, 2003 by a common inventor of this Patent Application and the patent application Ser. Nos. 10/428,899 and 10/455,151 are hereby incorporated by reference in the present Patent Application.

Referring to FIG. 1B for the frequency-tuning AOTF 120 configured as an Acousto-optical cell that includes two crystals 118-1 and 118-2. The Acousto-optical crystals have a narrow-band optical filtering Bragg grating. Two electrodes 180-1 and 180-2 are connected to the Acousto-optical crystals 118-1 and 118-2 to control the frequency-tuning function of these two AO crystals. The Acousto-optical crystals are provided with diffraction phase gratings for intra-cavity narrow-band wavelength filtering (namely AOTF: Acousto-optical-tunable-filter). Specifically, both crystal cells are aligned to the Bragg's angles for high diffraction efficiency in the first order diffraction. As further described in more details in the co-pending patent application Ser. No. 10/455,151, the AOTF of this invention is implemented with a non-collinear AO design in which the acoustic wave propagates almost perpendicular to the light-wave, therefore, this AOTF is enabled to take advantage of the high frequency diffraction effect to achieve narrow filtering bandwidth while using a very small crystal size (<5 mm in length). Furthermore, by using a second crystal as disclosed or a second column as shown, the frequency shift is corrected with the second crystal or crystal column functioning as a second AOTF. The gratings can also be implemented as Surface Acoustic Wave (SAW) grating and the tunable filter can be implemented as a SAW-based tunable filter. The SAW grating is similar to that of the embodiments as shown above instead the surface acoustic wave (SAW) grating is reflective. The center optical frequency of the Acousto-optical gratings is tuned electrically by means of RF signals. The second crystal is implemented as a second order filter and also as a wavelength shift compensator. Therefore, the double pass through the second order optical narrow-band filter will result in superb optical oscillation line-width. As oppose to other designs of AOTFs that are large and inefficient in terms of power consumption, the AOTF design implemented is much smaller in size and consumes as little as <200 mw of RF power. Thus, this enables the integration of the AOTF into a telecomm standard 18 pin-butterfly package (1"×¾"×½") for industrial use. Further studies indicate the tuning range can be as high as 120 nm covering 300 channels of the 50 Ghz spacing ITU grid. With high-speed electronics, the tuning speed is in the order of microseconds. The improvements of the tuning speed described above are achieved because, unlike the conventional technologies, the turning speed of the AOTF is no longer the limiting factor. Compared to the conventional systems tuned by MEMS or thermal tuning elements the AOTF of is invention can provide higher tuning speed. Therefore, the tuning speed of the tuning electronics such as the locking speed of the phase lock loop (PLL) of an RF source now becomes the limiting factor of the tuning speed, and for this reason, the tuning speed is significantly improved.

The Acousto-optical (AO) crystals 118-1 and 118-2 are acting as volume gratings. When driven by an RF signal, the crystal lattice oscillates in accordance with the frequency of the RF signal resulting periodical variation of optical refractive index of the crystal. The physical length of a period (pitch) defines the grating's diffraction resolution as that of the fixed pitch grating, and is related to the frequency of the RF signal and the acoustic wave traveling speed inside of the crystal, the faster the speed, the longer the grating pitch. On the other hand, the oscillation strength defines the diffraction efficiency and that relates directly to the product of driven signal strength (RF power) and the AO crystal's Figure of Merit. The higher the Figure of Merit, the lower the driven RF power needed for the same level of AO grating diffraction efficiency. In addition to the general properties of regular volume gratings, the AO crystal gratings do provide means for very high efficiency of first-order diffraction. It is because of the nature that, the wave vectors of the traveling acoustic wave, incident optical wave and the diffracted optical wave must satisfy the phase matching condition according to the Braggs law of diffraction. Therefore, with proper design of the crystals, this invention makes use of the highly efficient property of the first-order diffraction as a narrow band optical filter.

Because of a traveling wave nature of the AO diffraction grating, the diffracted light is frequency shifted by the amount of the acoustic frequency. The direction of the shift is dependent upon the relative direction of the acoustic wave and the incident light wave and can be understood by the analogy of Doppler Shift. The resonant cavity are implemented with two crystals for practical applications, in order to reduce the production costs, the two crystals are manufactured as one crystal with two cells as one preferred embodiment implemented in one of the products based on the configuration disclosed in this invention. When the first order diffraction from the first crystal enters into the second crystal it is frequency-shifted. Again the shift is a first order diffraction shift but with an opposite frequency shift after the second crystal. This double diffracted light results in a zero net frequency shift.

To a specific crystal, the Figure of Merit defines its responsiveness to a driven RF signal. For meaningful Acousto-optical interactions, high Figure of Merit crystals are of interests, these include crystals composed of Lithium Niobate ($LiNbO_3$), Tellurium Dioxide ($TeO_2$), Mercury Chloride ($Hg_2Cl_2$), etc. And with RF excitation, two acoustic oscillation modes exist that derives different applications. These modes are longitudinal mode and shear mode (transverse mode), and are dependent on the cut orientation relative to crystal principle axes. For Tellurium Dioxide, which is one of the preferred embodiments of this invention, the longitudinal mode is relative easy to excite and with fast acoustic speed. It has low acoustic attenuation but relatively low Figure of Merit, and therefore, requires relatively high RF power. In shear mode, its velocity is very slow which results in very high, e.g., easily by 2 orders of magnitudes, Figure of Merit. Therefore, a shear mode $TeO_2$ is used as the crystals for configuring the Acousto-optical filter. Other than these materials discussed above, for the purpose of implementing this invention, any birefringent crystals that have high Acousto-optical Figure of Merit may be employed to form the AOTF.

Figure 2A:
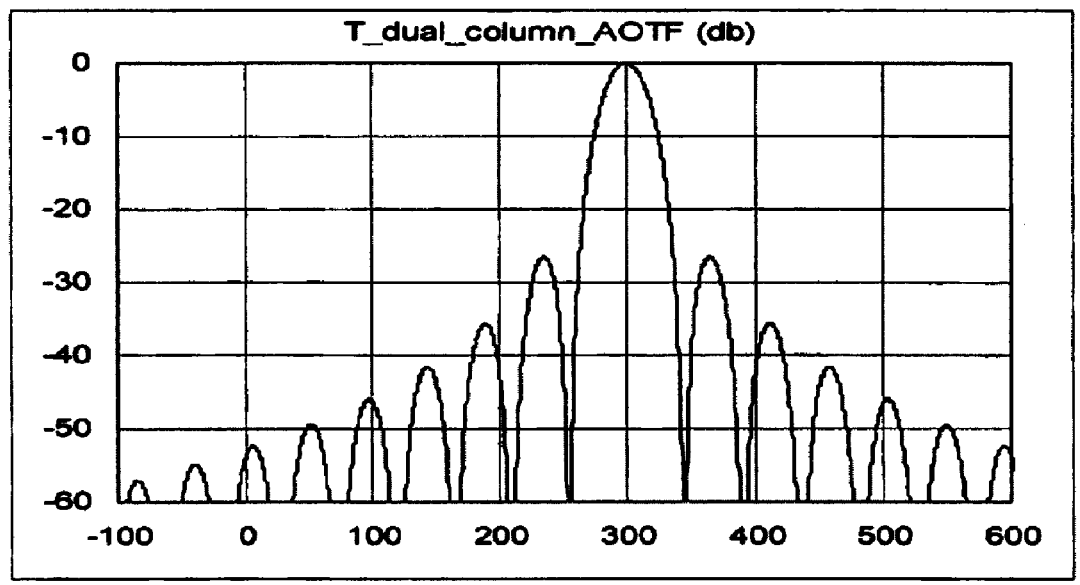
FIG. 2A is a diagram showing the waveforms of the AOTF passband.
Figure 2B:
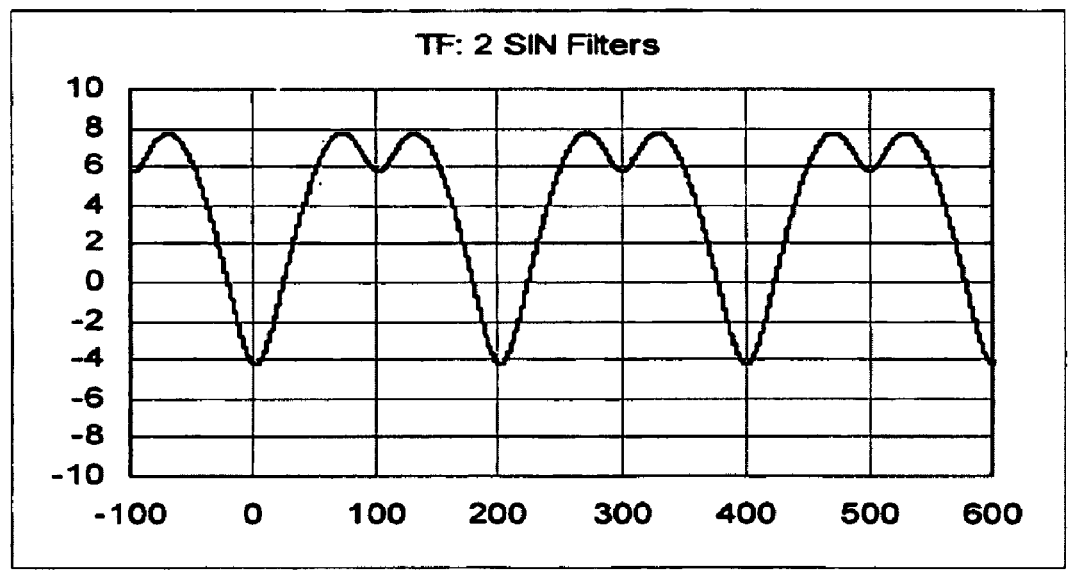
FIG. 2B is a diagram showing the waveforms of the TF passband as fixed repetitive square waves.

FIG. 2A shows a typical Sinc-function-like profile of the AOTF pass band. The acoustic frequencies as applied by the acoustic tuning electrodes 180-1 and 180-2 and the optical-acoustic interaction length determine the AOTF bandwidth, while FIG. 2B shows the waveform of TF filtering that is designed to have a pass band profile with a fixed repetitive periodic waveform. According to the narrow band tuner as shown in FIG. 1A, the AOTF, 120 in this design, acts as a tunable "broad wavelength" band-pass filter while the thin film filter 115 acts as multiple wavelength selective band-pass filter passing all wavelengths on ITU grids of a C or L or C+L spectrum band defined for telecomm applications. As shown in FIGS. 1A, and 2A, the AOTF 120 provides filtering function with a Sinc-function-like profile, and at a particular 3 db pass bandwidth, would not provide the necessary pass band flatness required for telecomm applications. Ideally it would prefer to have a perfect square profile with shape stop bands. It also lacks the side mode (side band) rejection needed for neighboring channels of telecomm signals. But it does provide the capability of wavelength tuning seamlessly across a wide wavelength range. On the other hand, thin film filters are known to have very flat pass bands and sharp stop bands of a telecom thin film filter, however, the wavelength ranges of the pass band are fixed and non tunable. By combining these two filters in series and by aligning the AOTF pass band to one of the TF filter pass band, the particular range of wavelengths selected by both the AOTF and the TF is passed. In other word, the AOTF hovers over the TF filter profile in optical frequency domain. By applying an RF frequency the center of this AOTF is tuned to a particular pass band of the TF filter. That particular wavelength is therefore being selected and passed.

The bandwidth upon which the signal can be passed is determined by both the filter profiles of the AOTF 120 and the TF 115. When these two filters put together in a serial arrangement as shown, the pass band profile of the AOTF needs to be compensated for flatness of the over all filter. This is accomplished by designing the TF filter to have a dip (attenuation) in the pass band as shown in FIG. 2B. Therefore, the combine filter profile results in a rather flat, wide pass band as required of a telecom filter while maintaining a sharp stop band profile.

Figure 3A:
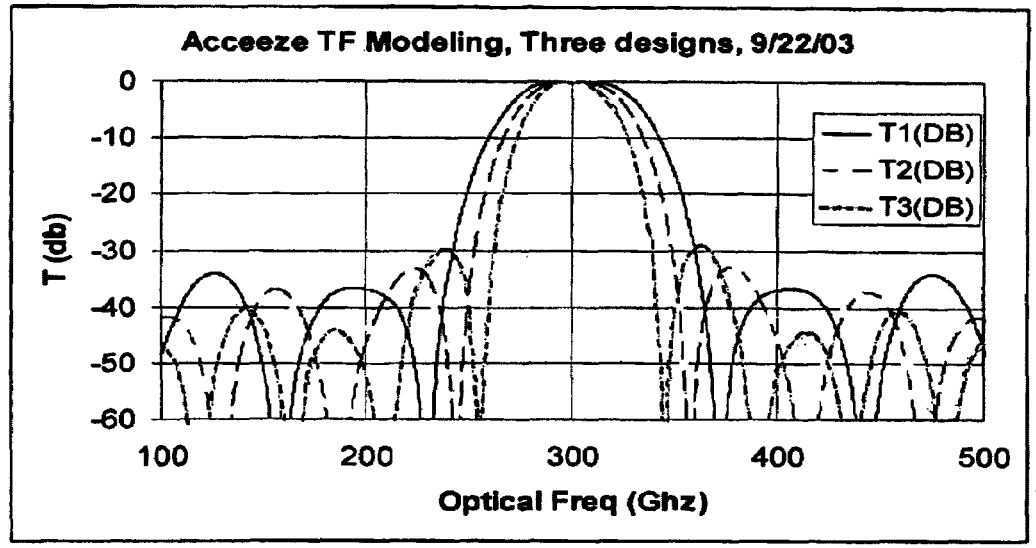
FIGS. 3A and 3B are waveforms of the narrow band filters based on a simulation analysis for a filter configured according to FIG. 1A.
Figure 3B:
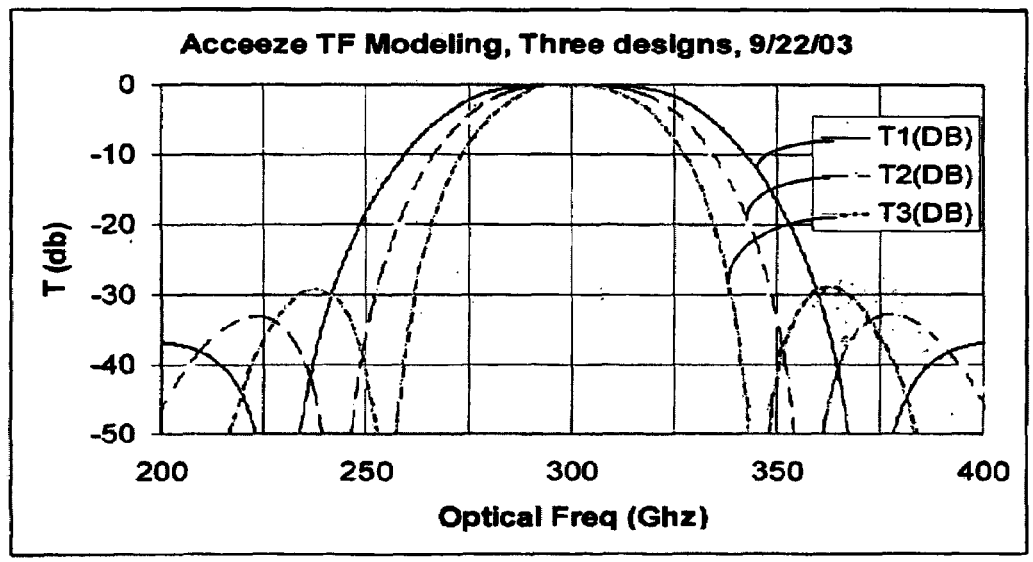

FIGS. 3A and 3B are waveform diagrams for illustrating the simulation results of a tunable filter design with three AOTF bandwidth options for narrow, medium and wide band filters. The simulation results as summarized in Table 1. As the operation of the AOTF alone would still lack the performance requirement that there is insufficient side band suppression, the TF filter in this modeling comprises of a Sine-shaped filter with 100 Ghz repetition spacing and a third harmonic of this filter as that shown in FIG. 2B. A narrow band filter with higher level of performance in terms of pass band flatness, stop band sharpness and side-band-suppression-ratio are therefore provided by a configuration as shown in FIG. 1A.

TABLE 1

| Filter BW Points | T1 BW (Ghz) | T2 BW (Ghz) | T3 BW (Ghz) |
|---|---|---|---|
| −0.5 db | 38 | 24.5 | 16.5 |
| −1.0 db | 41 | 31.5 | 23 |
| −3.0 db | 56 | 45 | 34 |
| −25 db | 112 | 92 | 74 |
| @+/−100 Ghz | <−35 db | <−37 db | <−40 db |

Figure 4:
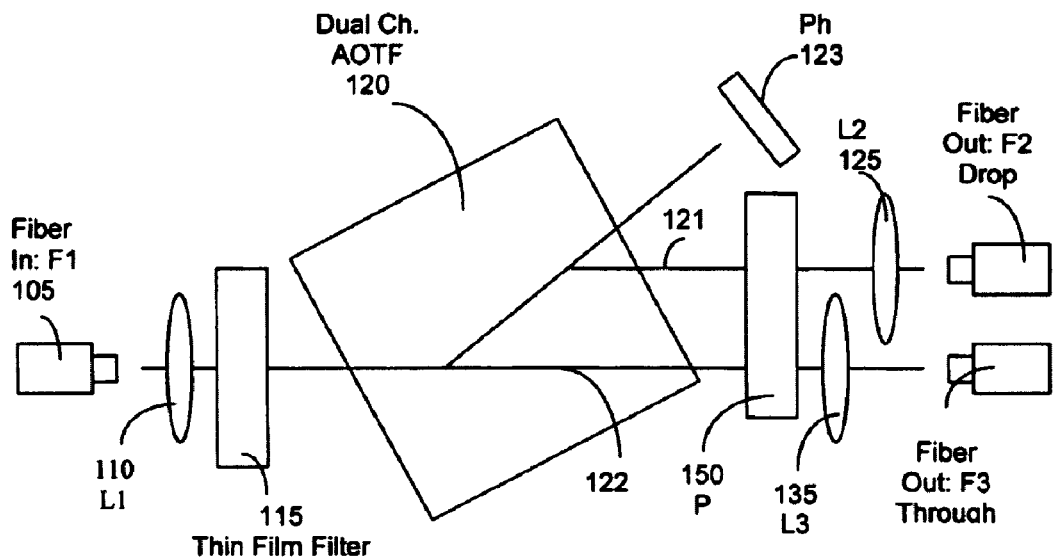
FIGS. 4 and 5 are two alternate preferred embodiments of a narrow filter of FIG. 1.

FIG. 4 is an alternate preferred embodiment of this invention by placing a polarizer 150 after the AOTF 120 for the purpose of further improving the signal quality for input optical signals that are polarized (with known polarization state). The first-order diffracted light in projecting through the AOTF birefringent crystals is polarized 90 degrees from the incident light. In passing through the dual column AOTF 120, the first-order diffracted light further enters into the second column and is diffracted again in the second AO column. Its polarization is again rotated 90 degrees to align back to the original incident light polarization. By adding a polarizer, any single diffraction residue signals off the first column or the second column that result in a polarization 90 degrees away from the incident and the double diffracted light is eliminated before coupling to the output fiber. This improves the signal to noise ratio (SNR) of the filter and also improves the filter Q quality.

Figure 5:
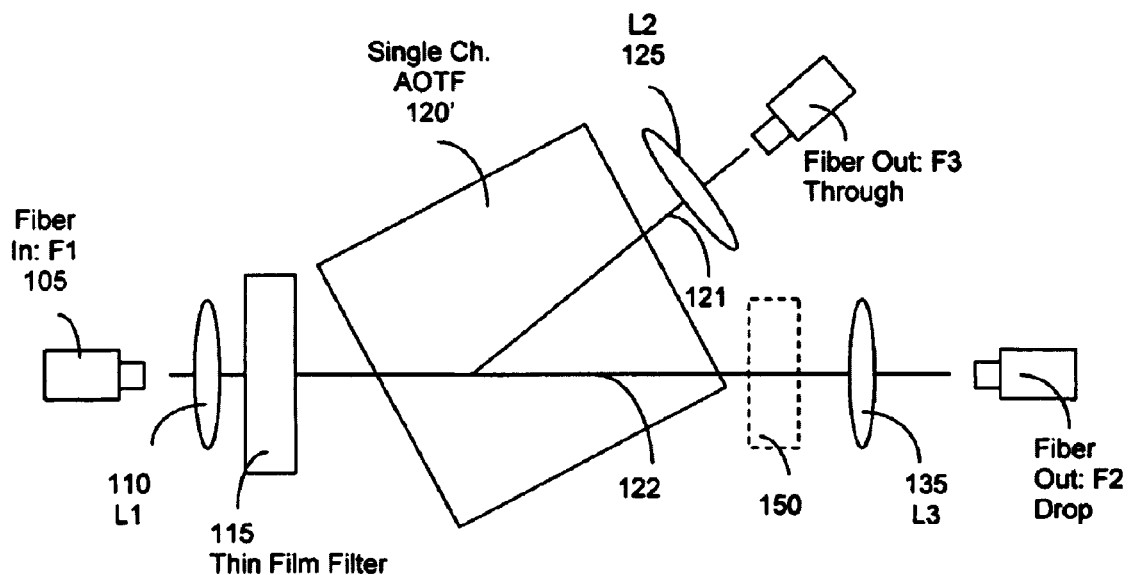

FIG. 5 is a functional block diagram for another preferred embodiment of this invention. In this embodiment of narrow band filter, a single column AOTF 120' is implemented instead of a dual column AOTF 120 of FIG. 1A. Compared to FIG. 1A, this embodiment has a more simplified configuration while the signal filter performance for is not as good as the system presented in FIG. 1A due to a lower side-band-suppression ratio (SBSR) and a frequency shift by the acoustic frequency to the optical frequency as a result of the AO interaction. However, this simplified system would be well suited for applications that allows <20 db of SBSR by taking into account that the un-diffracted light is not frequency shifted. As an option, this embodiment may also be implemented with a polarizer 150 that is shown in dashed box to improve filter performance and lower channel cross talk. The benefit of a single column AOTF with TF configuration is lower insertion loss as compared with the dual column AOTF design due to that factual <100% first-order diffraction efficiency of the AOTF.

Figure 6A:
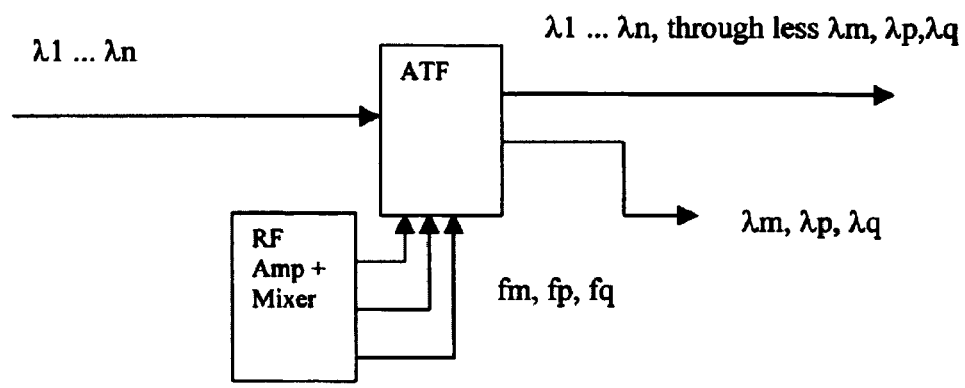
FIGS. 6A and 6B are functional block diagram of a tunable filter and the waveform of wavelength tuning.
Figure 6B:
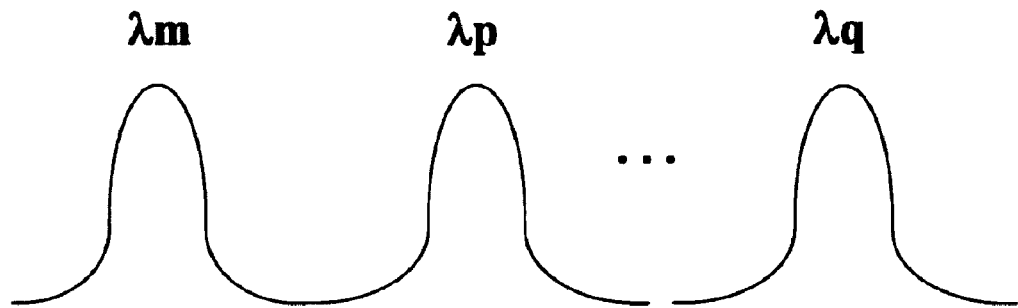

With tunable filter configurations as shown in FIGS. 1A, 4 and 5, the AOTF can be driven with multiple RF frequencies (fm, fp, fq), e.g., the waveform shown in FIG. 6B, through an electrical RF mixer. These RF frequencies correspond to AOTF filter pass bands $\lambda m$, $\lambda p$, $\lambda q$ and at center of pass bands of the TF filter. Referring to FIG. 6A for a functional block diagram of a multiple channel tunable filter/blocker to perform a function of passing or blocking multiple wavelengths by applying corresponding RF frequencies the AOTF filter. If the TF filter pass bands are designed have band pass ranges centered around the ITU grids of telecom wavelength with either a 50 Ghz or 100 Ghz wavelength spacing, the AOTF filter as driven by the RF ampere mixer 200 operates as a tunable filter over a broad range of wavelengths as a multiple channel filter. If the thin film filter is not on grid but ITU spaced, then a thermal control of its operating temperature is applied to move its pass bands to the ITU grid in order to combine with the AOTF to operate a combined tunable filter as a multiple channel filter with each channel centered at the ITU grids. The wavelength passing or blocking as described for the AOTF refers to selecting the thorough ($0^{th}$ order) or the filtered ($1^{st}$ order) light as output. In the case of selecting through light ($0^{th}$ order light) as output, the wavelengths centered at the filter pass bands are being blocked (dropped). In the case of selecting filtered light (1st order light), the wavelengths centered at the filter pass bands are being passed.

Figure 7A:
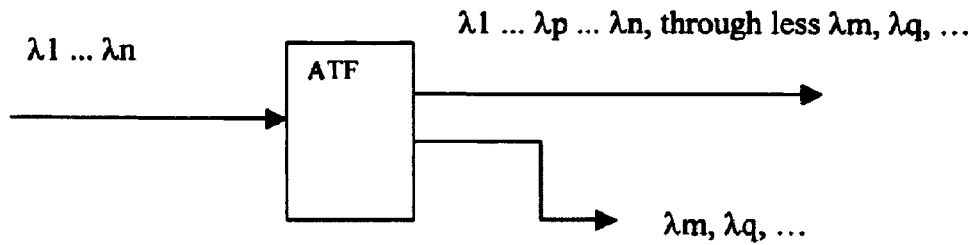
FIGS. 7A and 7B are functional block diagram of an alternate tunable filter of FIG. 6A and the waveform of wavelength tuning.
Figure 7B:
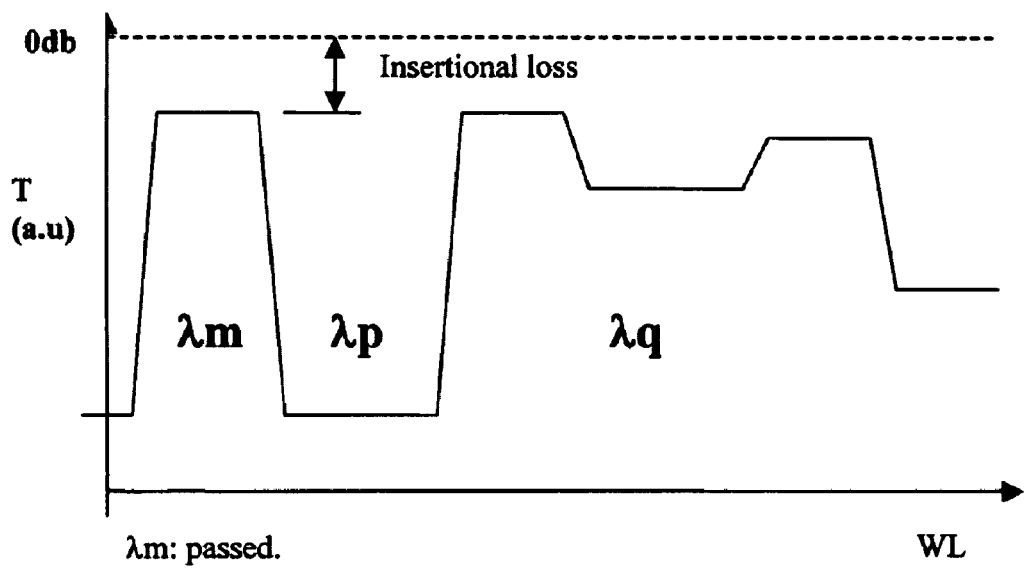

Referring to FIG. 7A for a functional block of a multiple channel tunable filter and attenuator of this invention. The first order diffraction efficiency of the AOTF 120 depends on the strength of the RF signal applied to the crystals in the AOTF filter. The AOTF can therefore control the signals passed through and attenuated the filter by controlling the amplitude of the RF signals applied to the AOTF. As shown in FIG. 7B, when an RF signal with a waveform as shown is applied to the AOTF, signals in a range represented by $\lambda m$ is passed, while signals in a range represented by $\lambda p$ is blocked. The AOTF is operated as an attenuator to attenuate the signals in a range of wavelengths represented by $\lambda q$.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A tunable filter comprising:
   a thin-film filter for band-passing at least two bands of wavelengths; and a tunable band-passing device tunable over said at least two bands for tuning to a tunable pass-band spectrally overlapped with one of said at least two bands.

2. The tunable filter of claim 1 wherein:
   said tunable band-passing device further comprising an Acousto-optical cell tunable with acoustic wave signals.

3. The tunable filter of claim 2 wherein:
   said Acoustic-optic cell further comprising a TeO2 in shear mode with an acoustic wave traveling in a direction substantially aligned with an crystal axis.

4. The tunable filter of claim 2 wherein:
   said Acoustic-optic cell further comprising a TeO2 in shear mode with an optical wave traveling in a direction substantially aligned with an crystal axis.

5. The tunable filter of claim 1 wherein:
   said thin-film filter cooperating with said tunable band-pass device for generating a tunable output waveform having substantially a square waveform spectrally corresponding to said at least two bands.

6. The tunable filter of claim 1 wherein:
   said thin-film filter cooperating with said tunable band-pass device for generating a tunable output waveform having substantially a square waveform over a spectral range of a C-band, an L-band and an S-band.

7. The tunable filter of claim 1 wherein:
   said tunable band-pass device band-passing a tunable substantially Sine-function waveform and said thin film filter band-passing a substantially square waveform with a center attenuated dip for compensating said tunable substantially Sine-function waveform.

8. The tunable filter of claim 1 wherein:
said tunable band-passing device further comprising an Acousto-optical cell having a first and second Acousto-optical diffraction means having a set of narrow-band optical filtering Bragg grating.

9. The tunable filter of claim 8 wherein:
said first and second Acousto-optical diffraction means comprising a first Acousto-optical crystal and a second Acousto-optical crystal.

10. The tunable filter of claim 8 further comprising:
a first electrode connected to said first Acousto-optical diffraction means and a second electrode connected to said second Acousto-optical diffraction means.

11. The tunable filter of claim 10 wherein:
said first electrode is connected to an RF signal for tuning a central frequency of said narrow band Bragg grating.

12. The tunable filter of claim 10 wherein:
said second electrode is connected to a second electric source to provide a second order filtering for compensating a wavelength shift.

13. The tunable filter of claim 8 wherein:
said first and second Acousto-optical diffraction means having diffraction phase gratings for intra-cavity narrow-band wavelength filtering.

14. The tunable filter of claim 8 wherein:
said thin-film filter cooperating with said tunable band-pass device for generating a tunable output waveform having substantially a square waveform spectrally corresponding to said at least two bands of wavelengths.

15. The tunable filter of claim 8 wherein:
said thin-film filter cooperating with said tunable band-pass device for generating a tunable output waveform having substantially a square waveform over a spectral range of a C-band, an L-band and an S-band.

16. The tunable filter of claim 8 wherein:
said tunable band-pass device band-passing a tunable substantially Sine-function waveform and said thin film filter band-passing a substantially square waveform with a center attenuated dip for compensating said tunable substantially Sine-function waveform.

17. The tunable filter of claim 8 further comprising:
a first and a second collimating lens for collimating a first and a second output optical signals from said first and second diffraction means of said tunable band-pass device.

18. The tunable filter of claim 8 wherein:
said first and second Acousto-optical diffraction means are formed as a first column and a second column respectively in a single Acousto-optical crystal.

19. The tunable filter of claim 8 further comprising:
said first and second Acousto-optical diffraction means are formed as a first column and a second column respectively in a birefringent crystal having a predefined responsiveness to an radio-frequency (RF) driven signal.

20. The tunable filter of claim 8 wherein:
said first and a second Acousto-optical diffraction means having said narrow-band optical filtering Bragg grating further comprising a surface acoustic wave (SAW) grating.

21. The tunable filter of claim 1 further comprising:
a photo diode for receiving an optical signal from said tunable band-pass device for monitoring optical intensity.

22. The tunable filter of claim 1 wherein:
said thin-film filter is provided for band-passing bands of wavelengths substantially aligned with a Telecommunication ITU wavelength grid.

23. The tunable filter of claim 1 further comprising:
a polarizer for receiving an optical signal from said tunable band-pass device for reducing a residual polarization of said optical signal.

24. The tunable filter of claim 1 wherein:
said tunable band-pass device further includes a means for adjusting an optical intensity of said tunable pass-band.

25. The tunable filter of claim 1 wherein:
said tunable band-passing device further comprising an Acousto-optical cell having a single Acousto-optical diffraction column having a set of narrow-band optical filtering Bragg grating.

26. A tunable optical filter comprising:
a frequency-tuning device configured as an Acousto-optical cell for cooperating with a fixed wavelength band-pass filter for flexibly tuning a pass-band of optical signals for passing therethrough.

27. The tunable optical filter of claim 26 wherein:
said Acousto-optical cell further comprising a first and a second Acousto-optical crystal.

28. The tunable optical filter of claim 26 wherein:
said Acousto-optical cell further comprising a first and a second Acousto-optical diffraction means disposed in an Acousto-optical crystal.

29. The tunable optical filter of claim 26 wherein:
said Acousto-optical cell further comprising a first and a second Acousto-optical diffraction columns respectively disposed in an Acousto-optical crystal.

30. The tunable optical filter of claim 26 wherein:
said first and second Acousto-optical cells are formed as a first column and a second column respectively in a birefringent crystal having a predefined responsiveness to an radio-frequency (RF) driven signal.

31. The tunable optical filter of claim 26 wherein:
said first and a second Acousto-optical cells having said narrow-band optical filtering Bragg grating further comprising a surface acoustic wave (SAW) grating.

32. The tunable optical filter of claim 26 wherein:
said fixed wavelength band-pass filter comprising a thin-film filter.

33. The tunable optical filter of claim 26 wherein:
said fixed wavelength band-pass filter comprising a fixed wavelength band-pass filter for band-passing bands of wavelengths substantially aligned with a Telecommunication ITU wavelength grid.

34. The tunable optical filter of claim 26 wherein:
said frequency-tuning device configured as a non-collinear Acousto-optical cell having an acoustic wave propagates almost perpendicular to an optical transmission therethrough.

35. The tunable filter of claim 26 wherein:
said Acoustic-optic cell further comprising a TeO2 in shear mode with an acoustic wave traveling in a direction substantially aligned with an crystal axis.

36. The tunable filter of claim 26 wherein:
said Acoustic-optic cell further comprising a TeO2 in shear mode with an optical wave traveling in a direction substantially aligned with an crystal axis.

37. The tunable filter of claim 26 wherein:
said Acousto-optical cell having a single Acousto-optical diffraction column having a set of narrow-band optical filtering Bragg grating.

38. A tunable optical attenuator comprising:
a frequency-tuning device configured as an Acousto-optical cell for cooperating with a fixed wavelength band-pass filter for flexibly tuning an intensity of a pass-band of optical signals for attenuating a designated pass-band of optical signals passing therethrough.

39. The tunable optical attenuator of claim 38 wherein:
said Acousto-optical cell further comprising a first and a second Acousto-optical crystal.

40. The tunable optical attenuator of claim 38 wherein:
said Acousto-optical cell further comprising a first and a second Acousto-optical diffraction means disposed in an Acousto-optical crystal.

41. The tunable optical attenuator of claim 38 wherein:
said Acousto-optical cell further comprising a first and a second Acousto-optical diffraction columns respectively disposed in an Acousto-optical crystal.

42. The tunable optical attenuator of claim 38 wherein:
said first and second Acousto-optical cells are formed as a first column and a second column respectively in a birefringent crystal having a predefined responsiveness to an radio-frequency (RF) driven signal.

43. The tunable optical attenuator of claim 38 wherein:
said first and a second Acousto-optical cells having said narrow-band optical filtering Bragg grating further comprising a surface acoustic wave (SAW) grating.

44. The tunable optical attenuator of claim 38 wherein:
said fixed wavelength band-pass filter comprising a thin-film filter.

45. The tunable optical attenuator of claim 38 wherein:
said fixed wavelength band-pass filter comprising a fixed wavelength band-pass filter for band-passing bands of wavelengths substantially aligned with a Telecommunication ITU wavelength grid.

46. The tunable optical attenuator of claim 38 wherein:
said frequency-tuning device configured as a non-collinear Acousto-optical cell having an acoustic wave propagates almost perpendicular to an optical transmission therethrough.

47. The tunable optical attenuator of claim 38 wherein:
said frequency-tuning device further includes a means to adjust an optical intensity of said pass-band.

48. A method for configuring a tunable optical filter comprising:
employing an Acousto-optical cell for configuring a frequency-tuning device for cooperating with a fixed wavelength band-pass filter for flexibly tuning a pass-band of optical signals for passing therethrough.

49. The method of claim 48 wherein:
said step of employing said Acousto-optical cell further comprising a step of employing said Acousto-optical cell having a first and a second Acousto-optical crystal.

50. The method of claim 48 wherein:
said step of employing said Acousto-optical cell further comprising a step of employing said Acousto-optical cell having a first and a second Acousto-optical diffraction means disposed in an Acousto-optical crystal.

51. The method of claim 50 wherein:
said step of employing said first and a second Acousto-optical cells further comprising a step of employing said first and second Acousto-optical cells having said narrow-band optical filtering Bragg grating comprising a surface acoustic wave (SAW) grating.

52. The method of claim 48 wherein:
said step of employing said Acousto-optical cell further comprising a step of employing said Acousto-optical cell having a first and a second Acousto-optical diffraction columns respectively disposed in an Acousto-optical crystal.

53. The method of claim 48 wherein:
said step of employing said Acousto-optical cell further comprising a step of employing said Acousto-optical cell having a first column and a second column respectively in a birefringent crystal having a predefined responsiveness to an radio-frequency (RF) driven signal.

54. The method of claim 48 wherein:
said step of cooperating with said fixed wavelength band-pass filter comprising a step of cooperating with a thin-film band-pass filter.

55. The method of claim 48 wherein:
said step of cooperating with said fixed wavelength band-pass filter further comprising step of cooperating with a fixed wavelength band-pass filter for band-passing bands of wavelengths substantially aligned with a Telecommunication ITU wavelength grid.

56. The method of claim 48 wherein:
said step of employing said frequency-tuning device configured as a non-collinear Acousto-optical cell further comprising a step of propagating an acoustic wave along a direction almost perpendicular to an optical transmission therethrough.

57. A method of configuring a tunable optical attenuator comprising:
configuring an Acousto-optical cell as a frequency-tuning device for cooperating with a fixed wavelength configured band-pass filter for flexibly tuning an intensity of a pass-band of optical signals for attenuating a designated pass-band of optical signals passing therethrough.

* * * * *